United States Patent
Chen et al.

(10) Patent No.: US 8,490,248 B2
(45) Date of Patent: Jul. 23, 2013

(54) HINGE AND AN ELECTRONIC DEVICE WITH THE SAME

(75) Inventors: Kuan-Chih Chen, Shulin (TW); Chaio-Liang Tseng, Shulin (TW); Tzung-Yang Tsai, Shulin (TW)

(73) Assignee: Shin Zu Shing Co., Ltd., Shulin (TW)

( * ) Notice: Subject to any disclaimer, the term of this patent is extended or adjusted under 35 U.S.C. 154(b) by 472 days.

(21) Appl. No.: 12/803,297

(22) Filed: Jun. 23, 2010

(65) Prior Publication Data

US 2011/0317338 A1    Dec. 29, 2011

(51) Int. Cl.
*E05C 17/64* (2006.01)

(52) U.S. Cl.
USPC ............... 16/342; 16/264; 16/292; 16/281; 16/286; 16/296; 455/575.3; 361/679.06; 361/679.07; 361/679.27

(58) Field of Classification Search
USPC ............... 16/242, 239, 325, 335, 286, 342, 16/292, 299, 303, 281, 284, 389, 273, 283, 16/296; 403/383; 455/575.3; 361/679.06, 361/679.07, 679.27
See application file for complete search history.

(56) References Cited

U.S. PATENT DOCUMENTS

| | | | | |
|---|---|---|---|---|
| 3,851,354 A * | 12/1974 | Anderson | ......................... | 16/331 |
| 5,077,551 A * | 12/1991 | Saitou | ............................ | 345/207 |
| 6,378,171 B1 * | 4/2002 | Suzuki et al. | ................... | 16/342 |
| 6,553,625 B2 * | 4/2003 | Lin et al. | ......................... | 16/342 |
| 6,634,061 B1 * | 10/2003 | Maynard | ......................... | 16/342 |
| 6,684,456 B2 * | 2/2004 | Lee | ................. | 16/342 |
| 6,754,081 B2 * | 6/2004 | Rude et al. | .................... | 361/725 |
| 6,796,542 B2 * | 9/2004 | Tsai | ........................... | 248/291.1 |
| 7,404,234 B2 * | 7/2008 | Lee et al. | ........................ | 16/322 |
| 7,574,944 B2 * | 8/2009 | Yang | ................................ | 74/567 |
| 7,954,203 B2 * | 6/2011 | Chen et al. | ...................... | 16/367 |
| 8,186,014 B2 * | 5/2012 | Pecar et al. | ..................... | 16/286 |
| 8,250,709 B2 * | 8/2012 | Jou | ................................ | 16/330 |
| 2003/0115719 A1 * | 6/2003 | Lee | ................................ | 16/335 |
| 2005/0251964 A1 * | 11/2005 | Lu et al. | .......................... | 16/342 |
| 2010/0154170 A1 * | 6/2010 | Chen et al. | ..................... | 16/303 |
| 2011/0000049 A1 * | 1/2011 | Shen | .............................. | 16/342 |
| 2011/0119867 A1 * | 5/2011 | Chen et al. | ..................... | 16/342 |

* cited by examiner

*Primary Examiner* — Victor Batson
*Assistant Examiner* — Emily Morgan
(74) *Attorney, Agent, or Firm* — Alan Kamrath; Kamrath IP Lawfirm, P.A.

(57) ABSTRACT

A hinge is mounted between a cover and a body of an electronic device and has an eccentric sleeve and a resisting assembly abutting against each other. When the cover is pivoted, the eccentric sleeve is rotated as well. Because the eccentric sleeve has sectors with varied radiuses, the resisting assembly is compressed to conduct various resisting forces when the eccentric sleeve is rotated. When the cover is opened to a normal visual angle, the hinge provides a constant largest torque. Therefore, the cover is held at the normal visual angle even though the user hits the touch panel on the cover.

17 Claims, 11 Drawing Sheets

HINGE AND AN ELECTRONIC DEVICE WITH THE SAME

BACKGROUND OF THE INVENTION

1. Field of the Invention

The present invention relates to a hinge and, especially, to a hinge mounted between a cover and a body of an electronic device to allow the cover to pivot relative to the body.

2. Description of the Prior Arts

The conventional hinge is mounted between a cover and a body of an electronic device. Conventional hinges have disclosed various structures to provide torque variation so that the force exerted by users to open the cover varies accordingly, and that does help users to easily open/close the cover. Also, said conventional structure has to provide a positioning function in a manner such that the cover of the electronic device can be kept at certain visual angle. In general, in order to achieve the above function, there are two kinds of the hinge structures: (1) a structure with a resilient sleeve embracing a pintle, both having corresponding flat surfaces to be selectively engaged with each other, during the rotation of the pintle, as the positioning function, and (2) a structure with a stationary positioning washer (called a cam) non-rotatably mounted on a pintle and a rotating positioning washer rotatably mounted on the pintle, each having corresponding protrusions and detents to be engaged to generate the torque variation and positioning function.

With reference to FIG. 11, the torque provided by the conventional hinge with the resilient sleeve and the pintle both having corresponding flat surfaces changes with the rotating angle of the cover relative to the body. Suppose that the torque is positive when the cover is opening and that the torque is negative when the cover is closing. At the very beginning, the cover is closed relative the body, and the flat surface of the resilient sleeve faces and engages with flat surface of the pintle so that the conventional hinge provides a largest torque when the cover starts to be pivoted to open. Once the cover is pivoted over 12 degrees, the flat surfaces of the resilient sleeve and the pintle are separated. Then, the torque is decreased until the cover is pivoted at about 35 degrees. When the cover is pivoted over 35 degrees, the conventional hinge provides a constant torque. When the cover is being closed and the included angle between the cover and the body is less than 10 degrees, the corresponding flat surfaces engage with each other so that the torque decreases rapidly to urge the cover closing quickly. Therefore, the user needs to provide a certain force to open the cover. Further, the cover quickly closing causes the latching between the cover and the body to be firm. Another conventional hinge with positioning washers having corresponding protrusions and detents also has a similar torque variation as shown in FIG. 11.

Generally, when the cover is pivoted over 35 degrees, both conventional hinges are capable of holding the cover with its weight at a certain visual angle even though the torque is less than the largest torque. However, with the popularity of the electronic device and the development of the touch panel, the touch panel is widely mounted in the cover to replace the traditional display panel. When the user acts on the touch panel, the cover bears extra force besides its own weight. The conventional hinges do not provide enough torque to hold the cover with extra force. Thus, the conventional hinge is not suitable for the cover with a touch panel.

SUMMARY OF THE INVENTION

The main objective of the present invention is to provide a hinge to hold the cover of the electronic device when subjected to extra force. The hinge is mounted between the cover and the body of the electronic device and has an eccentric sleeve and a resisting assembly abutting against each other. When the cover is pivoted, the eccentric sleeve is rotated as well. Because the eccentric sleeve has sectors with varied radius, the resisting assembly is compressed to conduct various resisting forces when the eccentric sleeve is rotated. When the cover is opened to a normal visual angle, the hinge provides a constant largest torque. Therefore, the cover is held at the normal visual angle even though the user hits the touch panel on the cover.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
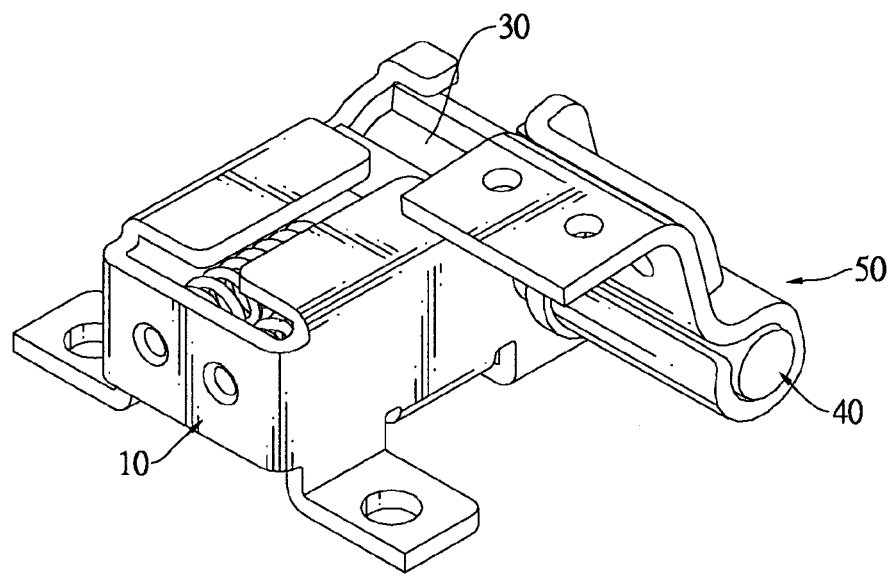
FIG. 1 is a perspective view of a hinge in accordance with the present invention.
Figure 2:
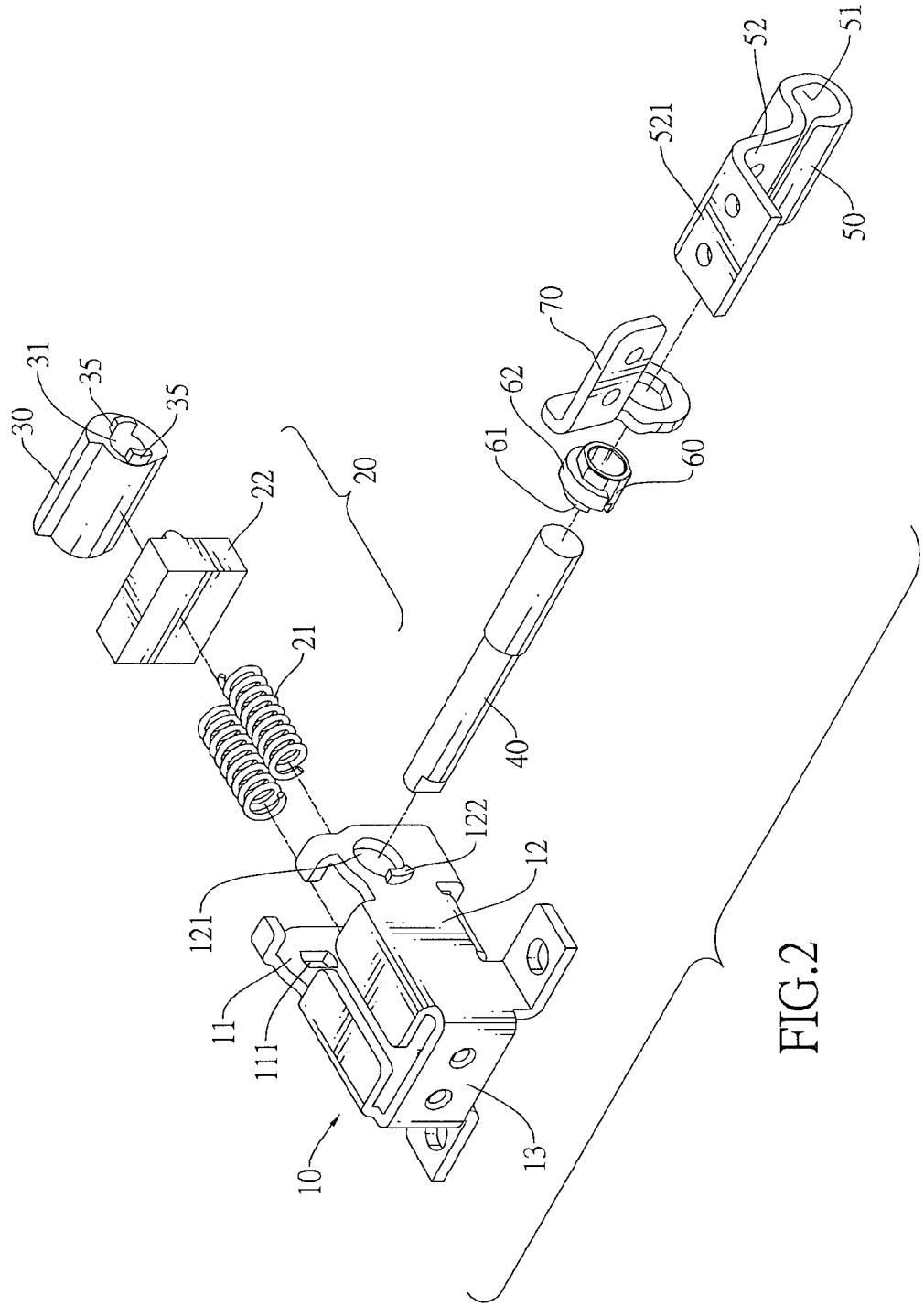
FIG. 2 is an exploded perspective view of the hinge in FIG. 1.

With reference to FIGS. 1 and 2, a hinge in accordance with the present invention comprises a stationary frame 10, a resisting assembly 20, an eccentric sleeve 30, a pintle 40 and a torque generating assembly.

Figure 3:
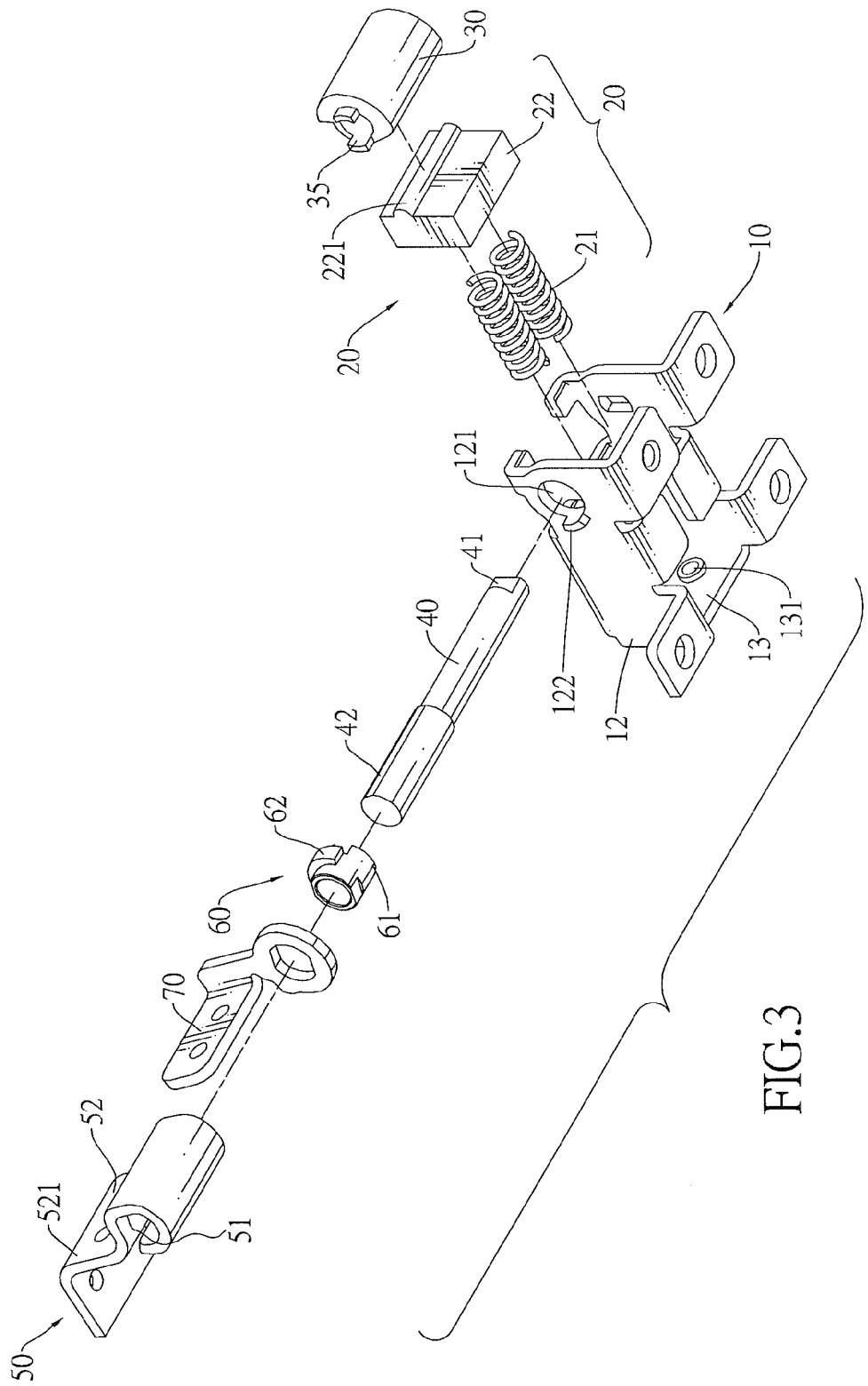
FIG. 3 is another exploded perspective view of the hinge in FIG. 1.

With reference to FIGS. 2 and 3, the stationary frame 10 has a first sidewall 11, a second sidewall 12 and an end wall 13. The end wall 13 is formed across the first sidewall 11 and the second sidewall 12. The first sidewall 11 has a keyed hole 111 formed therethrough. The second sidewall 12 has a through hole 121 formed therethrough and aligning with the keyed hole 111 of the first sidewall 11. The end wall 13 has at least one post 131 formed on an inner surface of the end wall 13.

The resisting assembly 20 is mounted in the stationary frame 10, is mounted between the first sidewall 11 and the second sidewall 12 and has a slide 22 and at least one resilient element 21. The slide 22 is mounted slidably between the first sidewall 11 and the second sidewall 12 of the stationary frame 10 and has a rib 221 formed on an outer surface of the slide 22. The resilient element 21 is clamped between an inner surface of the slide 22 and the end wall 13 of the stationary frame 10. Each resilient element 21 may be a spring and may be mounted around the post 131 on the end wall 13.

The eccentric sleeve 30 is mounted in the stationary frame 10, is mounted across the first sidewall 11 and the second sidewall 12 and has an axial hole 31, an initial sector 32, a lifting sector 33 and a steady sector 34. The axial hole 31 aligns with the keyed hole 111 and the through hole 121. The initial sector 32, the lifting sector 33 and the steady sector 34 are defined in sequence on the eccentric sleeve 30 and selectively abut the rib 221 of the slide 22. The lifting sector 33 has a first end 331 and a second end 332. The first end 331 is connected to the initial sector 32. The second end 332 is connected to the steady sector 34. The initial sector 32 has a radius that is a distance from a center 311 of the axial hole 31 to a periphery edge of the initial sector 32. The lifting sector 33 has a radius that is a distance from a center 311 of the axial hole 31 to a periphery edge of the lifting sector 33. The steady sector 34 has a radius that is a distance from a center 311 of the axial hole 31 to a periphery edge of the steady sector 34. The radius of the initial sector 32 is constant. The radius of the lifting sector 33 is gradually increased. The radius of the steady sector 34 is constant. The radius of the initial sector 32 is smaller than the radius of the steady sector 34. The first end 331 of the lifting sector 33 has a radius the same as the radius of the initial sector. The second end 332 of the lifting sector 33 has a radius the same as the radius of the steady sector 34.

The included angle of the initial sector 32 is at least 35 degrees, the included angle of the lifting sector 33 is at least 55 degrees, and the included angle of the steady sector 34 is at least 35 degrees. In a preferred embodiment, the included angle of the initial sector 32 is 125 degrees for corresponding to the rib 221 of the slide 22, the included angle of the lifting sector 33 is 55 degrees, and the included angle of the steady sector 34 is 180 degrees to provide constant torque.

With reference to FIGS. 2 and 3, the pintle 40 is mounted rotatably through the eccentric sleeve 30 and is attached securely to the stationary frame 10. In a preferred embodiment, the pintle 40 is mounted in sequence through the through hole 121 of the second sidewall 12 of the stationary frame 10 and the axial hole 31 of the eccentric sleeve 30. The pintle 40 has a keyed protrusion 41 formed on an end and engaging the keyed hole 111 of the first sidewall 11 of the stationary frame 10. The pintle 40 has a flat surface 42 formed on an outside wall thereof.

The torque generating assembly may be a resilient sleeve 50 mounted rotatably around the pintle 40 and is connected securely to the eccentric sleeve 30. The resilient sleeve 50 has a flat surface 51 formed on an inside wall thereof and selectively flush with the flat surface 42 of the pintle 40 to provide a positioning function.

Various structures are used to secure the eccentric sleeve 30 and the resilient sleeve 50. In a preferred embodiment, the hinge further comprises a connecting sleeve 60 and a connecting bracket 70 to secure the eccentric sleeve 30 and the resilient sleeve 50. The connecting sleeve 60 is mounted through the through hole 121 of the second sidewall 12 of the stationary frame 10 and has two protrusions 61 formed separately on an end thereof. The eccentric sleeve 30 has two protrusions 35 formed separately on an end thereof. The protrusions 61 of the connecting sleeve 60 respectively engage between the protrusions 35 of the eccentric sleeve 30 to hold the connecting sleeve 60 with the eccentric sleeve 30. The connecting bracket 70 is mounted securely around the connecting sleeve 60. The resilient sleeve 50 has a fastening wing 52 extending from an edge thereof. The connecting bracket 70 is attached securely to the fastening wing 52 of the resilient sleeve 50. The resilient sleeve 50 may have an extending wing 521 formed perpendicularly on an end of the fastening wing 52.

The stationary frame 10 further has a stop 122 formed on an outside surface of the second sidewall 12. The connecting sleeve 60 has an arc limit 62 formed on an outside wall thereof and selectively abutting the stop 122 of the stationary frame 10 to limit the rotating angle of the eccentric sleeve 30 and the resilient sleeve 50.

Figure 10:
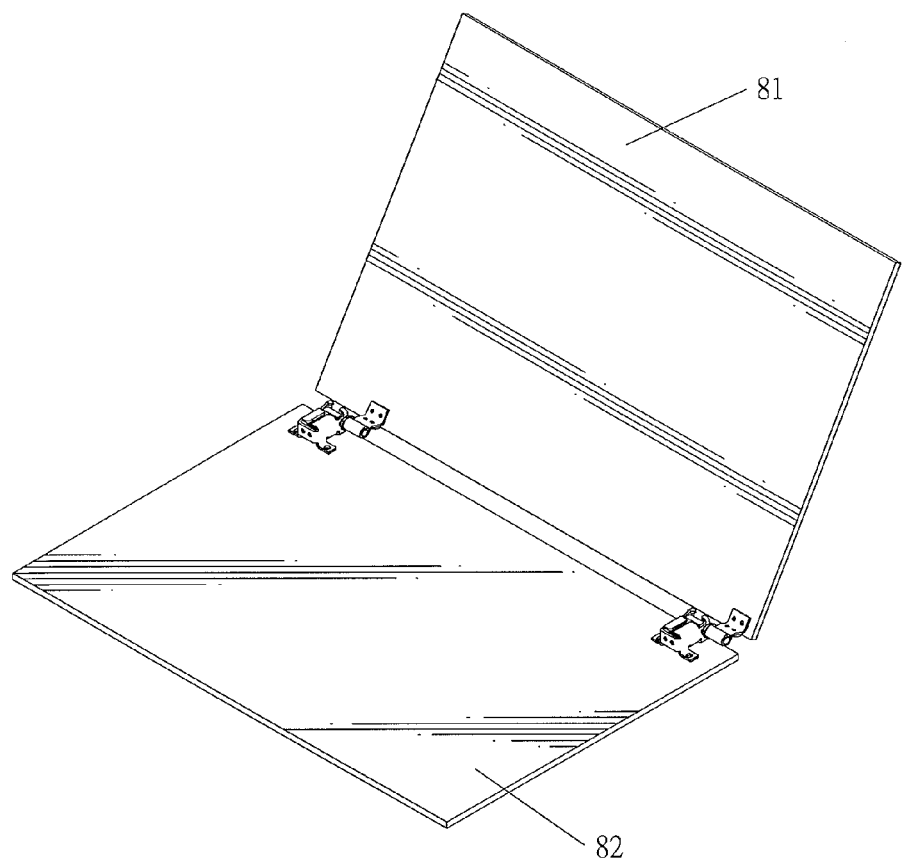
Figure 11:
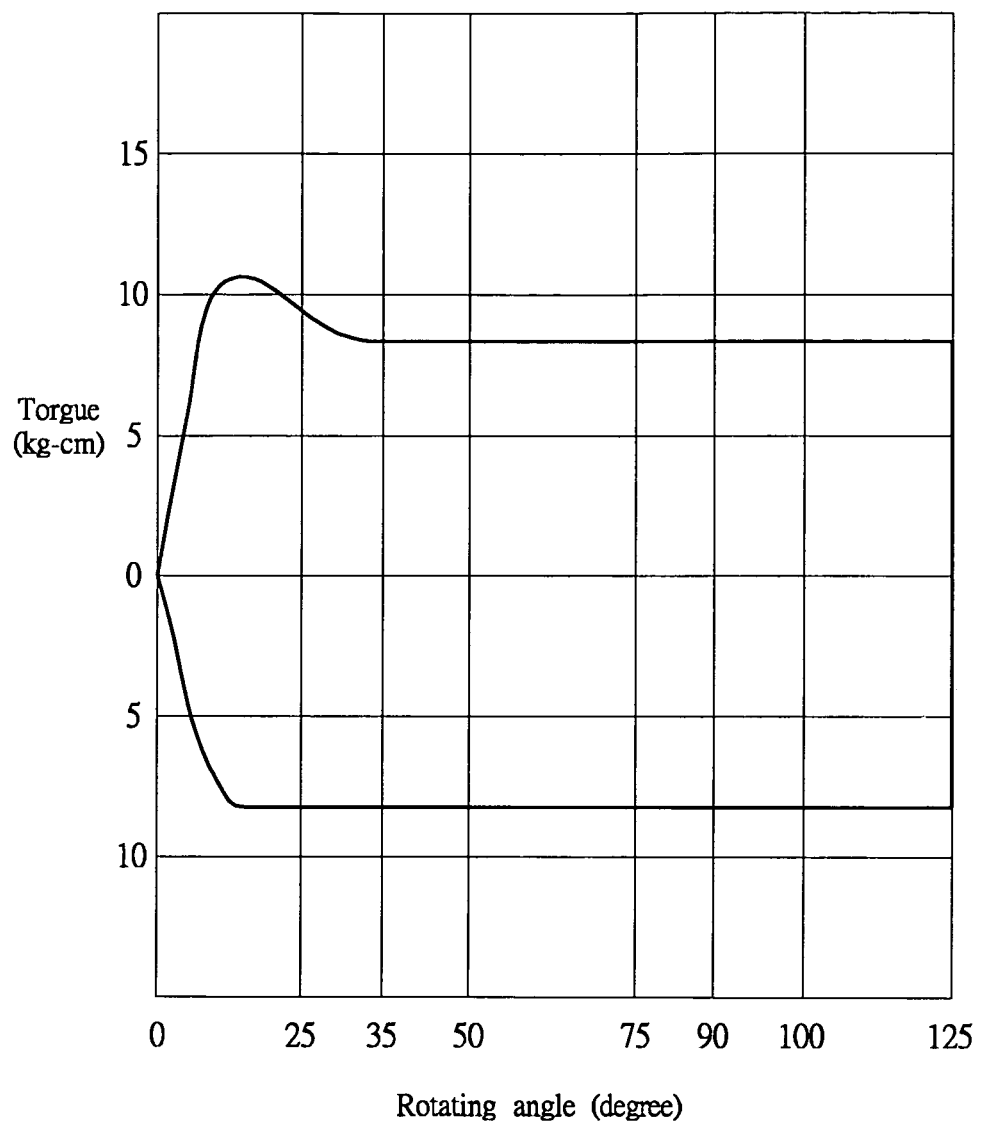
FIG. 11 is a graph depicting a number of a rotating angle plotted against torque of a conventional hinge.

With reference to FIG. 10, an electronic device in accordance with the present invention comprises a cover 81, a body 82 and at least one hinge as described. The hinge is mounted between the cover 81 and the body 82. The pintle 40 is attached securely to the cover 81. In a preferred embodiment, the extending wing 521 is flushly securely with the cover 81. The stationary frame 10 is attached securely to the body 82. When the cover 81 is pivoted relative to the body 82, the resilient sleeve 50 and the eccentric sleeve 30 are rotated relative to the stationary frame 10 and the resisting assembly 20.

Figure 4:
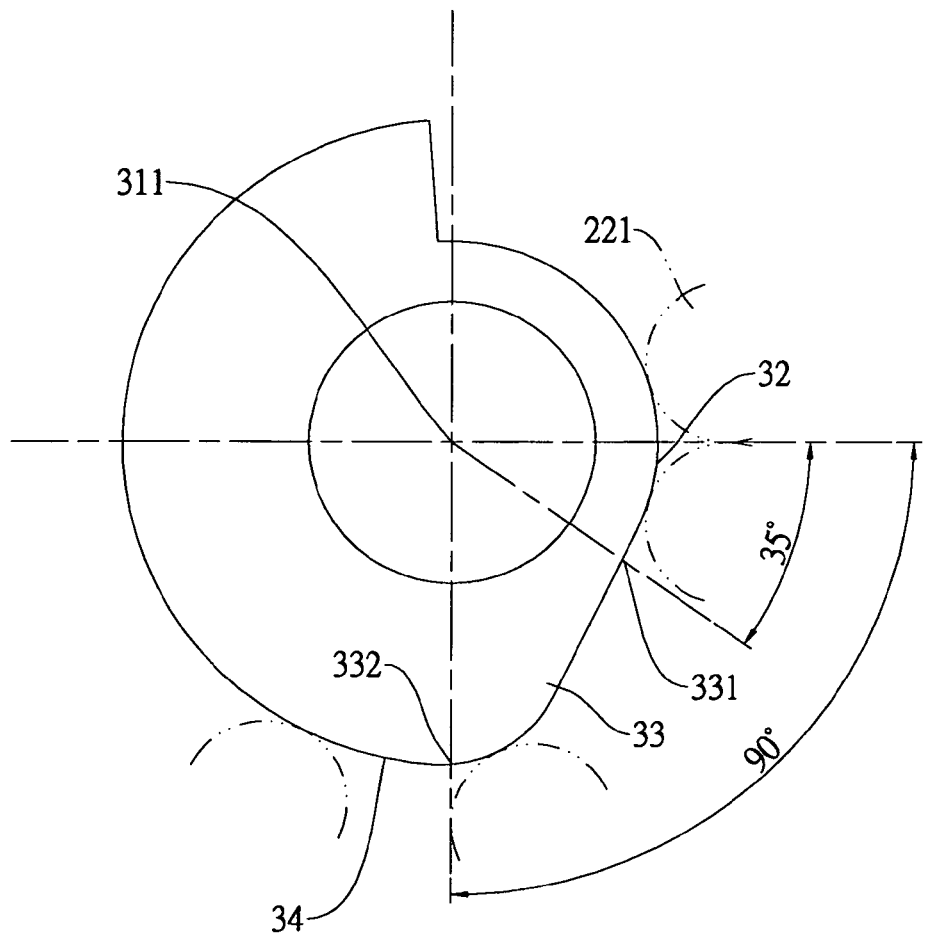
FIG. 4 is an end view of an eccentric sleeve of the hinge in FIG. 1.
Figure 5:
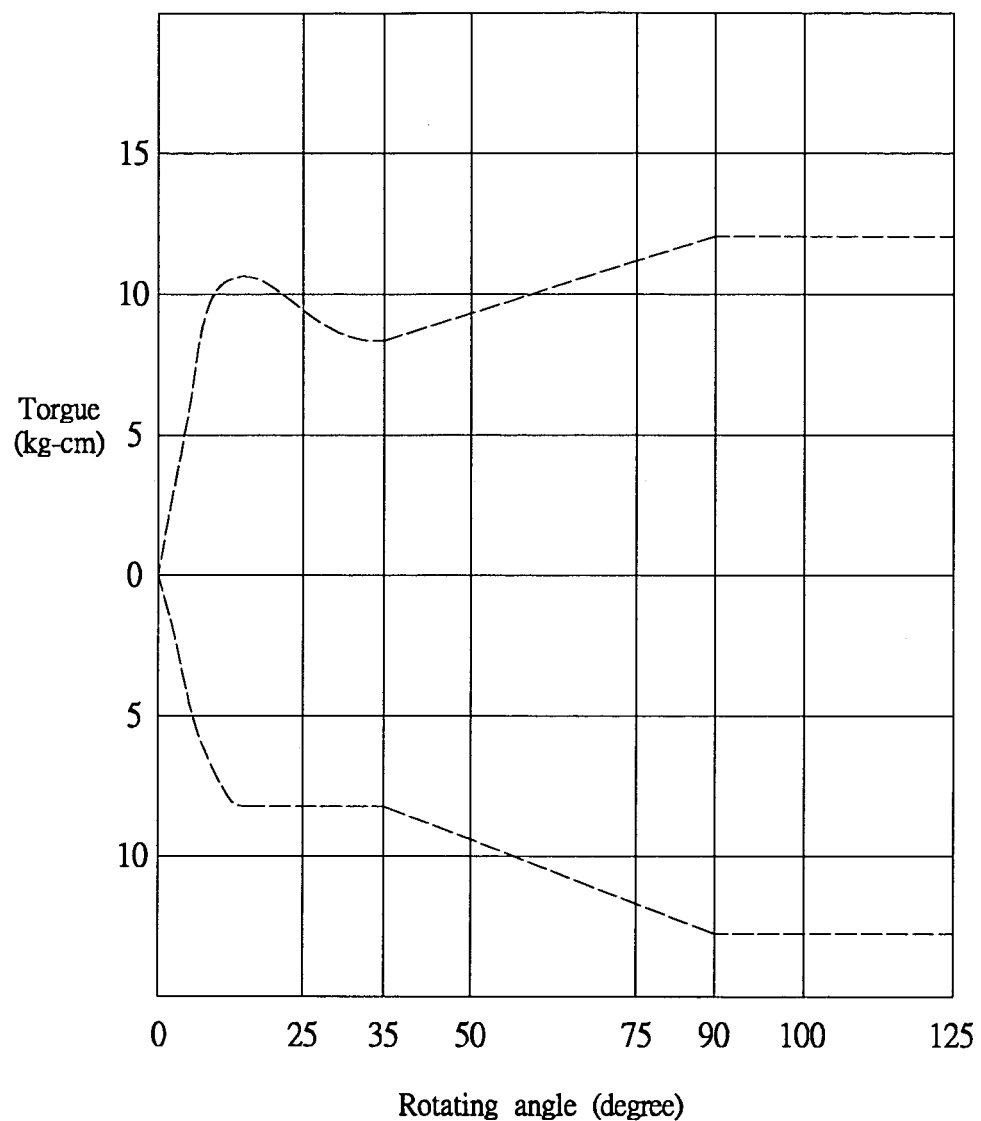
FIG. 5 is a graph depicting a number of a rotating angle plotted against torque of the hinge in FIG. 1.

With reference to FIG. 4, the eccentric sleeve 30 is rotated to various angles and the according torque is shown in FIG. 5.

Figure 6:
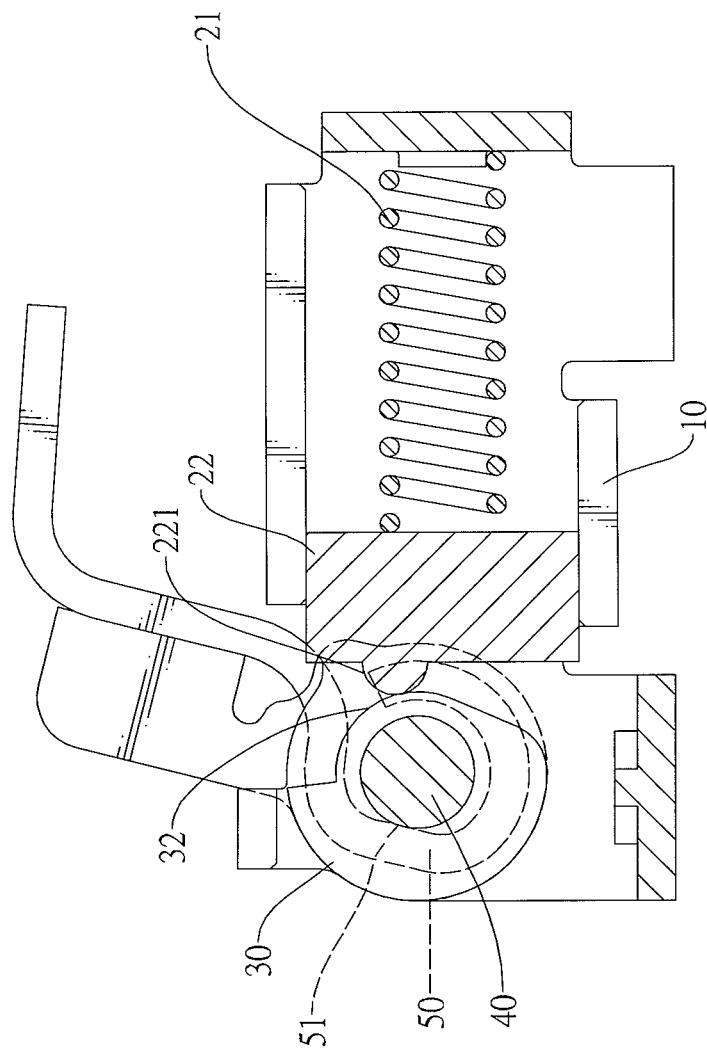
FIG. 6 is an operational side view in partial section of the hinge in FIG. 1, shown with the cover at 0 degree.

With further reference to FIG. 6, the cover 81 is closed at 0 degree and is flush with the body 82. The rib 221 of the slide 22 abuts the initial sector 32 of the eccentric sleeve 30. The flat surface 51 of the resilient sleeve 50 is flush with the flat surface 42 of the pintle 40 to provide a positioning function. When the cover 81 is opening, the positioning function provides a larger torque. After the flat surface 51 of the resilient sleeve 50 disengages with the flat surface of the pintle 40, the torque provided by hinge as described is decreased.

Figure 7:
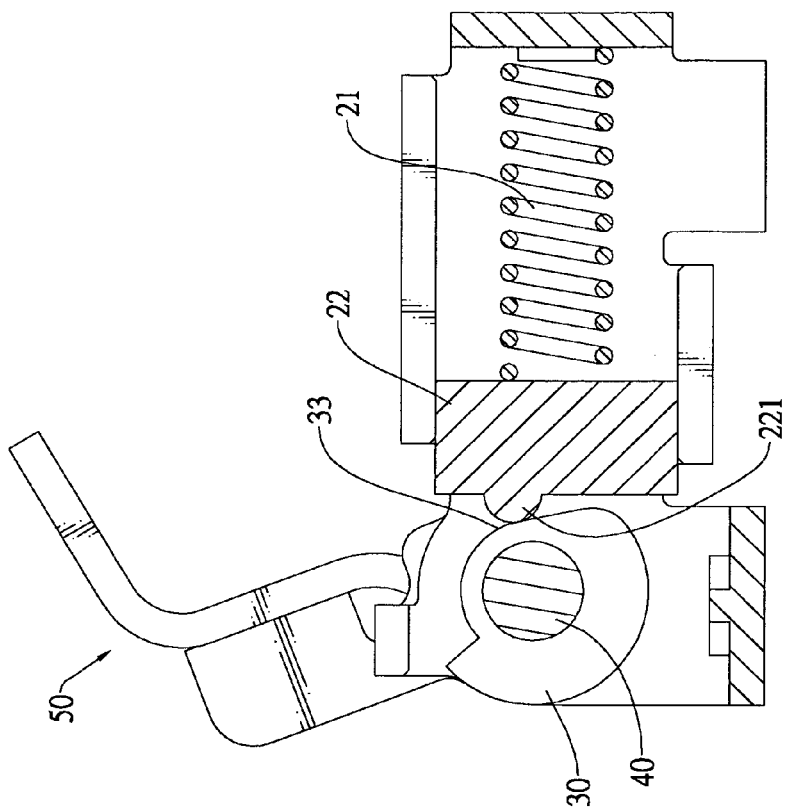
FIG. 7 is an operational side view in partial section of the hinge in FIG. 1, shown with the cover between 35 to 90 degrees.

With further reference to FIG. 7, the cover 81 is pivoted over 35 degrees. The eccentric sleeve 30 is rotated, and, then, the lifting sector 33 abuts the rib 221 of the slide 22. Since the lifting sector 33 has the gradually increasing radius, the slide 22 is pushed inward when the cover 81 is pivoting. Therefore, the slide 22 presses the resilient elements 21. The pressed resilient elements 21 provide an extra resisting force so that the hinge as described provides an increasing torque when the cover 81 is pivoted over 35 degrees.

Figure 8:
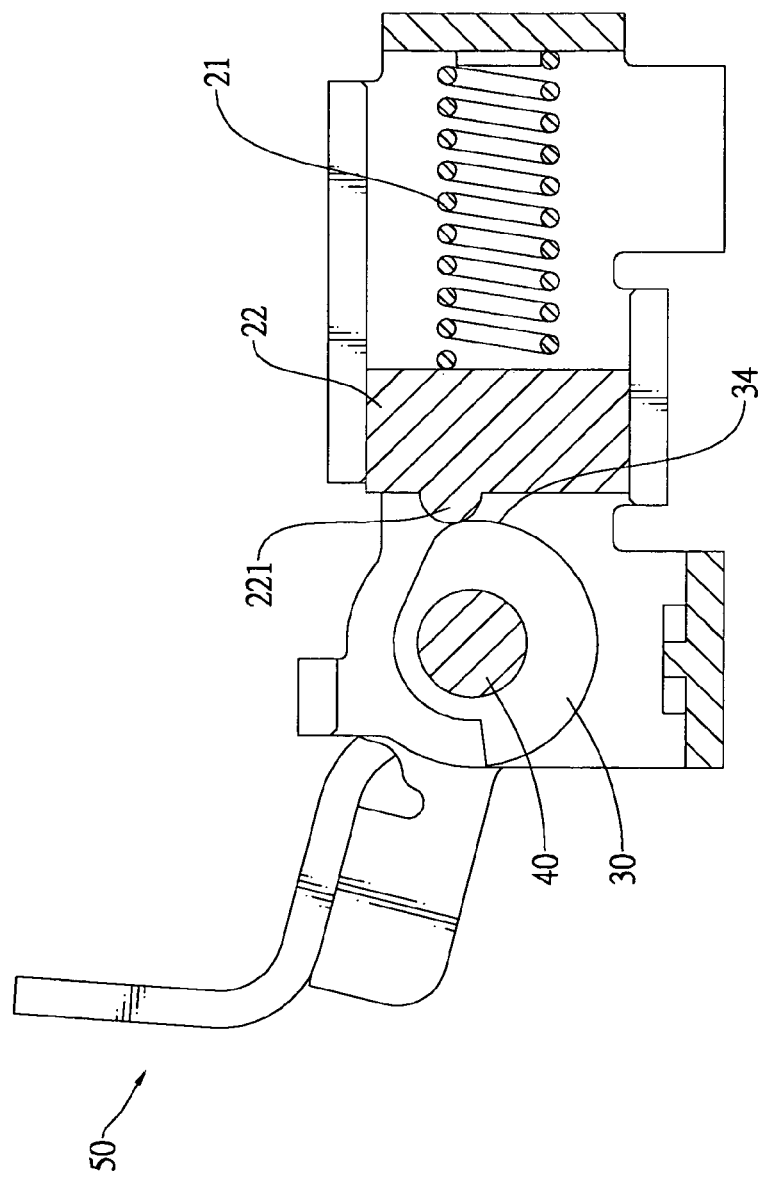
FIG. 8 is an operational side view in partial section of the hinge in FIG. 1, shown with the cover at 90 degrees.

With further reference to FIG. 8, the cover 81 is opened at 90 degrees. The eccentric sleeve 30 is rotated and the second end 332 of the lifting sector 33 abuts the rib 221 of the slide 22. The radius of the second end 332 of the lifting sector 33 has the largest radius so that the resilient elements 21 have the maximum compression. Therefore, the hinge as described provides the largest torque.

Figure 9:
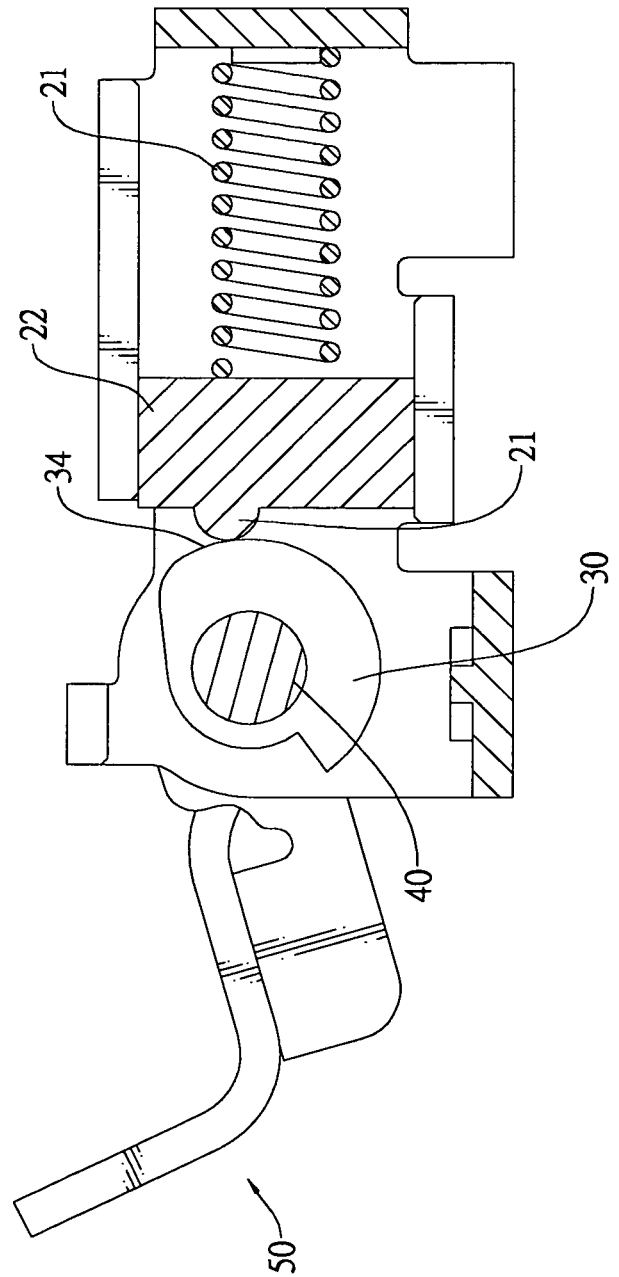
FIG. 9 is an operational side view in partial section of the hinge in FIG. 1, shown with the cover over 90 degrees.

With further reference to FIG. 9, the cover 81 is opened over 90 degrees. The eccentric sleeve 30 is rotated, and the steady sector 34 abuts the rib 221 of the slide 22. Since the radius of the steady sector 34 is the same as the second end 332 of the lifting sector 33 and is constant, the compression of the resilient elements 21 is constant so that the resistance of the resilient elements 21 is also constant. Therefore, the hinge as described provides the constant largest torque when the cover 81 is opened over 90 degrees. Because the cover 81 has a normal visual angle at 90 to 125 degrees, the constant largest torque holds the cover 81 firmly. Thus, even though the user may hit on the touch panel on the cover 81, the hinge as described has the ability to hold the cover 81.

FIG. 5 shows the torque variation. Before the cover 81 is opened to 35 degrees, the torque is mainly provided by the interaction of the flat surfaces of the resilient sleeve 50 and the pintle 40. When the cover 81 is opened over 35 degrees, the resisting assembly 20 provides extra torque. The person skilled in the art could change the torque generating assembly to other structures, such as positioning washers, without influencing the torque provided by the resisting assembly 20.

Even though numerous characteristics and advantages of the present invention have been set forth in the foregoing description, together with details of the structure and features of the invention, the disclosure is illustrative only. Changes may be made in the details, especially in matters of shape, size, and arrangement of parts, within the principles of the invention to the full extent indicated by the broad general meaning of the terms in which the appended claims are expressed.

What is claimed is:

1. A hinge comprising:
   a stationary frame;
   a resisting assembly mounted in the stationary frame and having at least one resilient element;
   an eccentric sleeve rotatably connected to the stationary frame and abutting against the resisting assembly, with the eccentric sleeve having an initial sector, a lifting sector, and a steady sector defined in sequence on the eccentric sleeve, with each sector having a radius, wherein the radius of the initial sector is smaller than that of the steady sector, wherein the radius of the lifting sector is gradually increased; a pintle rotatably inserted into the eccentric sleeve and non-rotatably attached to the stationary frame; and
   a connecting bracket connected to eccentric sleeve; with the connecting bracket further comprising a connecting sleeve connecting with the eccentric sleeve, wherein the connecting sleeve has two protrusions formed separately on an end thereof; wherein the eccentric sleeve has two protrusions formed separately on an end thereof and respectively engaging between the two protrusions of the connecting sleeve, wherein the stationary frame has a stop, and wherein the connecting sleeve further has an arc limit selectively abutting the stop.

2. The hinge as claimed in claim 1, wherein the resisting assembly comprises a slide clamped between the at least one resilient element and the eccentric sleeve and having
   a rib formed on an outer surface of the slide and selectively abutting the sectors of the eccentric sleeve.

3. The hinge as claimed in claim 1, with the connecting bracket further comprising a connecting sleeve connecting with the eccentric sleeve, wherein the connecting sleeve has two protrusions formed separately on an end thereof; and wherein the eccentric sleeve has two protrusions formed separately on an end thereof and respectively engaging between the two protrusions of the connecting sleeve.

4. The hinge as claimed in claim 1, wherein the radius of the initial sector of the eccentric sleeve is constant.

5. The hinge as claimed in claim 1, wherein the radius of the steady sector of the eccentric sleeve is constant.

6. The hinge as claimed in claim 1, wherein
   an included angle of an arc length of the initial sector is at least 35 degrees;
   an included angle of an arc length of the lifting sector is at least 55 degrees; and
   an included angle of an arc length of the steady sector is at least 35 degrees.

7. The hinge as claimed in claim 1, wherein
   an included angle of an arc length of the initial sector is 125 degrees;
   an included angle of an arc length of the lifting sector is 55 degrees; and
   an included angle of an arc length of the steady sector is 180 degrees.

8. The hinge as claimed in claim 1 further comprising a torque generating assembly having a resilient sleeve mounted rotatably around the pintle and having a fastening wing extending from an edge thereof and attached securely to the connecting bracket.

9. The hinge as claimed in claim 8, wherein
   the pintle has a flat surface formed on an outside wall thereof; and
   the resilient sleeve has a flat surface formed on an inside wall thereof and selectively flushing with the flat surface of the pintle.

10. The hinge as claimed in claim 8, wherein the slide has a rib formed on an outer surface of the slide and selectively abutting the sectors of the eccentric sleeve.

11. The hinge as claimed in claim 10, wherein
    the pintle has a flat surface formed on an outside wall thereof; and
    the resilient sleeve has a flat surface formed on an inside wall thereof and selectively flushing with the flat surface of the pintle.

12. The hinge as claimed in claim 10, wherein
    the stationary frame has
        a first sidewall having a keyed hole;
        a second sidewall opposite to the first sidewall and having a through hole; and
        an end wall formed between the first and second sidewalls;
    the slide of the resisting assembly is located between the first and second sidewalls;
    the at least one resilient element is clamped by the slide and the end wall;
    the eccentric sleeve has an axial hole aligning with the keyed hole and the through hole; and
    the pintle is rotatably mounted through the through hole of the second sidewall and the axial hole of the eccentric sleeve and non-rotatably engaging with the keyed hole.

13. The hinge as claimed in claim 12, wherein
    the end wall of the stationary frame has at least one post formed on an inner surface of the end wall; and
    each one of the at least one resilient element of the resisting assembly is mounted around a corresponding post on the end wall of the stationary frame.

14. A hinge comprising:
    a stationary frame;
    a resisting assembly mounted in the stationary frame and having at least one resilient element;
    an eccentric sleeve rotatably connected to the stationary frame and abutting against the resisting assembly, wherein the resisting assembly comprises a slide clamped between the at least one resilient element and the eccentric sleeve, with the eccentric sleeve having an initial sector, a lifting sector, and a steady sector defined in sequence on the eccentric sleeve, with each sector having a radius, wherein the radius of the initial sector is smaller than that of the steady sector, wherein the radius of the lifting sector is gradually increased;
    a connecting bracket connected to eccentric sleeve; and
    a torque generating assembly having a pintle rotatably inserted into the eccentric sleeve and non-rotatably attached to the stationary frame, and a resilient sleeve mounted rotatably around the pintle and having a fastening wing extending from an edge thereof and attached securely to the connecting bracket, wherein the stationary frame has a first sidewall having a keyed hole, a second sidewall opposite to the first sidewall and having a through hole, and an end wall formed between the first and second sidewalls; wherein the slide of the resisting assembly is located between the first and second sidewalls; wherein the at least one resilient element is clamped by the slide and the end wall; wherein the eccentric sleeve has an axial hole aligning with the keyed hole and the through hole; wherein the pintle is rotatably mounted through the through hole of the second sidewall and the axial hole of the eccentric sleeve and non-rotatably engaging with the keyed hole, with the connecting bracket further comprising a connecting sleeve mounted on the second sidewall of the stationary frame, wherein the connecting sleeve has two protrusions formed separately on an end thereof; and wherein the eccentric sleeve has two protrusions formed separately on an end thereof and respectively engaging between the two protrusions of the connecting sleeve.

15. The hinge as claimed in claim 14, wherein the second sidewall of the stationary frame has a stop, and wherein the connecting sleeve further has an arc limit selectively abutting the stop.

16. An electronic device comprising:
   at least one hinge comprising:
      a stationary frame;
      a resisting assembly mounted in the stationary frame and having at least one resilient element;
      an eccentric sleeve rotatably connected to the stationary frame and abutting against the resisting assembly, with the eccentric sleeve having an initial sector, a lifting sector, and a steady sector defined in sequence on the eccentric sleeve, with each sector having a radius, wherein the radius of the initial sector is smaller than that of the steady sector, wherein the radius of the lifting sector is gradually increased;
      a connecting bracket connected to eccentric sleeve; and
      a torque generating assembly comprising
         a pintle rotatably inserted into the eccentric sleeve and non-rotatably attached to the stationary frame; and
         a resilient sleeve mounted rotatably around the pintle and having a fastening wing extending from an edge thereof and attached securely to the connecting bracket;
   a cover; and
   a body, wherein the at least one hinge is mounted between the cover and the body, wherein the connecting bracket of each one of the at least one hinge is associated with the cover, and wherein the stationary frame of each one of the at least one hinge is connected to the body.

17. The electronic device as claimed in claim 16, wherein the resisting assembly comprises a slide clamped between the at least one resilient element and the eccentric sleeve and having
   a rib formed on an outer surface of the slide and selectively abutting the sectors of the eccentric sleeve.

* * * * *